United States Patent [19]
Tamaru et al.

[11] Patent Number: 5,657,205
[45] Date of Patent: Aug. 12, 1997

[54] VIBRATION-GENERATING-MOTOR MOUNTING STRUCTURE AND ITS MOUNTING METHOD

[75] Inventors: Toshiyuki Tamaru, Tokyo; Toshiki Yamanaka, Shizuoka, both of Japan

[73] Assignee: NEC Corporation, Tokyo, Japan

[21] Appl. No.: 511,587

[22] Filed: Aug. 4, 1995

[30] Foreign Application Priority Data

Aug. 8, 1994 [JP] Japan ................... 6-185053

[51] Int. Cl.⁶ ................................. H05K 1/18
[52] U.S. Cl. ................ 361/761; 310/81; 340/825.46; 361/809; 455/90
[58] Field of Search .............. 310/51, 81, 91; 74/87; 455/90, 347; 340/311.1, 407.1, 396.1, 825.46; 361/807, 809, 760, 761, 814, 825; 248/609, 615, 632–635, 638, 677, 686–688, 917

[56] References Cited

U.S. PATENT DOCUMENTS

| | | | |
|---|---|---|---|
| 4,632,599 | 12/1986 | Sadahiro | 404/124 |
| 4,786,889 | 11/1988 | Hayasaka | 340/311.1 |
| 4,794,392 | 12/1988 | Selinko | . |
| 4,864,276 | 9/1989 | Tribbey et al. | . |
| 4,879,759 | 11/1989 | Matsumoto | 455/348 |
| 4,886,227 | 12/1989 | Matl | 248/27.1 |
| 4,893,351 | 1/1990 | McKee et al. | . |
| 4,931,765 | 6/1990 | Rollins | 340/407 |
| 5,007,105 | 4/1991 | Kudoh et al. | . |
| 5,137,248 | 8/1992 | Sato | 248/634 |
| 5,510,954 | 4/1996 | Wyler | 361/685 |
| 5,535,092 | 7/1996 | Bang | 361/685 |

FOREIGN PATENT DOCUMENTS

| | | |
|---|---|---|
| 1-162747 | 11/1989 | Japan . |
| 2 134 734 | 8/1984 | United Kingdom . |
| 2 259 205 | 3/1993 | United Kingdom . |

*Primary Examiner*—Gerald P. Tolin
*Attorney, Agent, or Firm*—Young & Thompson

[57] ABSTRACT

A mounting structure of the vibration-generating-motor comprises a vibration-generating-motor and a holder for holding the vibration-generating-motor. A holding section of the holder contacts faced inner surfaces of a case and is held by the inner surfaces. Vibrations of the vibration-generating-motor are directly conveyed to the case through the holding section. For assembling, the holder holding the motor passes through a circuit board and is fixed by a hole formed on the circuit board. Then, the both ends of the holder are brought into contact with faced inner surfaces of the case so that the holder is held by the inner surfaces. The above structure enables vibrations of a vibration-generating-motor to be efficiently conveyed to the surface of the case and reduces undesirable sounds due to resonance of a circuit board.

8 Claims, 2 Drawing Sheets

VIBRATION-GENERATING-MOTOR MOUNTING STRUCTURE AND ITS MOUNTING METHOD

BACKGROUND OF THE INVENTION

The present invention relates to a vibration generating motor used for portable units, particularly to a vibration-generating-motor (hereinafter referred to as "vibrating motor") mounting structure and its mounting method.

In the case of a machine, apparatus, or device, generation or reception of a signal has been notified to a user or the like by means of blinking of light by a lamp or signal sounds generated by a buzzer or the like. However, some compact apparatuses or devices are provided with a system for notifying a user of generation or reception of a signal through vibrations. They include a clock for an aurally handicapped person, and a recent portable telephone and selective calling receiver.

For a selective calling receiver, a system for notifying a user of reception of a signal by sounds of a buzzer or speaker has widely been used. At a specific place, however, it may be preferable to generate vibrations of the receiver. Therefore, some models are provided with a system for notifying a user of reception of a signal through vibrations instead of selective ringing tones by assuming the above case.

The structure disclosed in the official gazette of Japanese Utility Model Laid-Open No. 162747/1989 (document 1) is known as a vibration generating section used for this type of the selective calling receiver. The vibration generating section disclosed in the document 1 uses a vibrating motor as a vibration source. In the case of the vibrating motor, the rotating shaft of a DC motor is provided with a weight whose center of gravity is deviated from the rotating shaft. The vibrating motor is set on a circuit board and whose outer periphery is held by a holder and the holder is fixed to the circuit board. In the case of this structure, however, vibrations generated by the vibrating motor are conveyed to the surface of a receiver case through the circuit board. Therefore, the structure has the problems that vibrations cannot efficiently be conveyed and undesirable sounds are produced due to resonance of the circuit board.

SUMMARY OF THE INVENTION

It is an object of the present invention to provide a vibrating motor mounting structure in which vibrations of a vibrating motor are efficiently conveyed to the surface of a case.

It is another object of the present invention to provide a vibrating motor mounting structure for reducing undesirable sounds from occurring due to resonance of a circuit board.

It is still another object of the present invention to provide a method of efficiently assembling the vibrating motor mounting structure and a selective calling receiver.

To achieve the above objects, the vibrating motor mounting structure of the present invention first has a holder for holding the outer periphery of a vibrating motor. The holder is arranged so as to contact the faced inner surfaces of a case and to be held. Thereby, vibrations of the vibrating motor are directly conveyed to a case or the surface of a selective calling receiver through the holder.

The vibrating motor mounting structure is assembled in accordance with the following procedure. First, a circuit board to be set into a case or a selective calling receiver is prepared in which a holder is previously inserted into and fixed to a hole formed on the circuit board. Then, the circuit board and the holder are arranged at a predetermined position on one inner surface of the case by adjusting the positions of them. Finally, the holder is brought into contact with the other faced inner surface of the case so as to be held. The mounting method of the present invention has advantages that it can easily be assembled and sounds generated by a circuit board can be reduced because the holder of the assembled structure does not directly contact the board or, even if it directly contacts the board, the contact area is small.

BRIEF DESCRIPTION OF THE DRAWINGS

The above and other objects, features, and advantages of the present invention will become apparent from the following detailed description when taken with the accompanying drawings in which.

DETAILED DESCRIPTION OF THE PREFERRED EMBODIMENTS

The present invention can be applied to various portable units. However, a case is described below in which the present invention is applied to a selective calling receiver.

Figure 1:
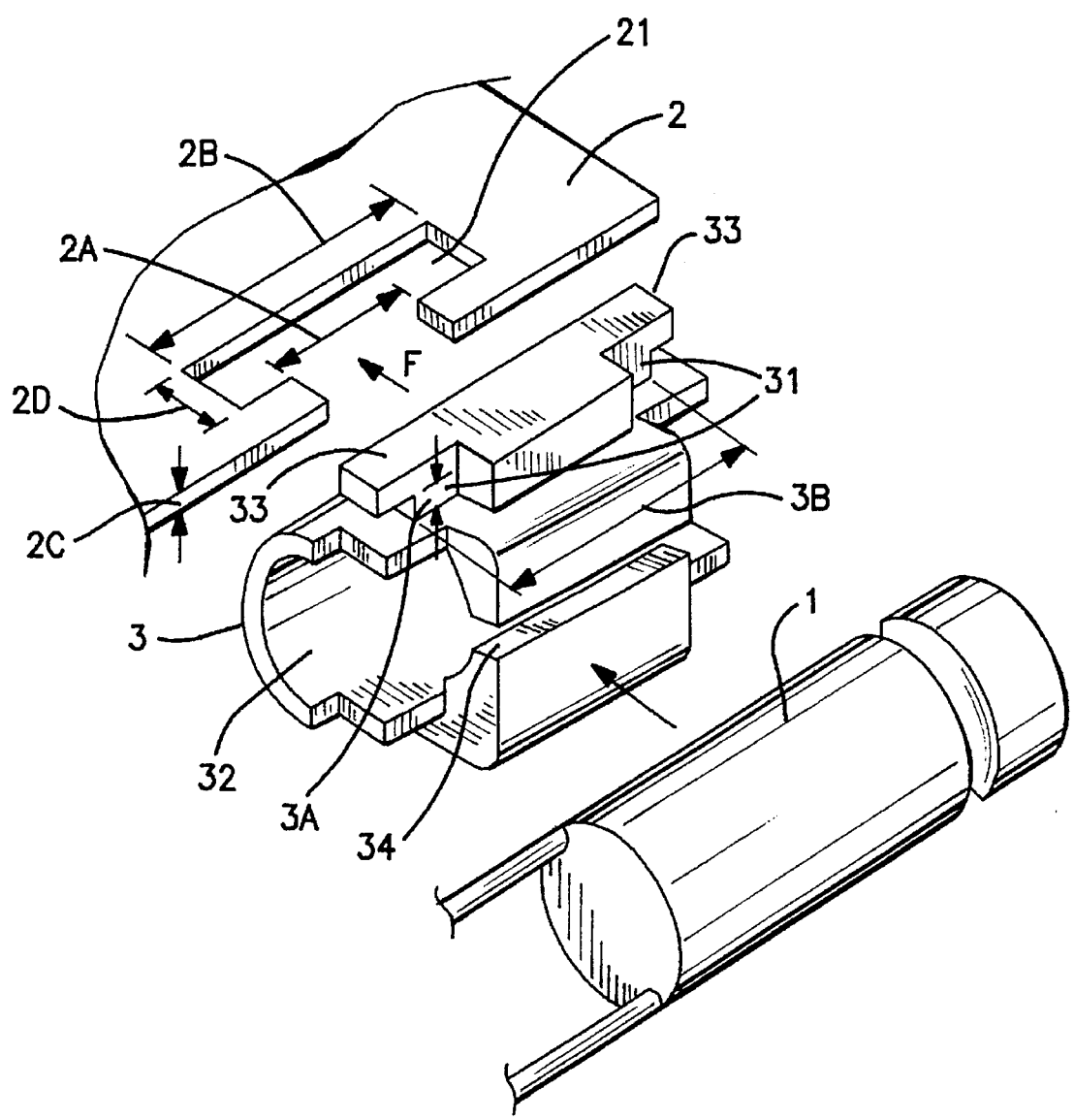
FIG. 1 is a partial exploded perspective view showing an embodiment of the vibrating motor mounting structure of the present invention.

FIG. 1 shows a part of the vibrating motor mounting structure of the present invention. In FIG. 1, a vibrating motor 1 has a weight whose center of gravity is deviated from the rotating shaft of a cylindrical DC motor on the shaft of the DC motor. The weight can be formed into a shape obtained by cutting off part of a disk. It is also possible to use a structure in which the rotating shaft of a motor is set to a position slightly deviated from the center of a disk. Though dimensions of a vibrating motor depend on the model, the vibrating motor of this embodiment has a diameter of 6 mm and a length of 15 mm.

A vibrating motor holder 3 comprises a motor holding section 32, a fixing section 31, and a tongue piece 33 contacting the inner surfaces of a case.

It is preferable that the motor holder 3 is made of an elastic damping material. Specifically, it is possible to use rubber, organic resin, or a macromolecular material for the motor holder 3. This embodiment uses silicon rubber for the motor holder 3. This material is properly selected in accordance with a condition such as an output of a vibrating motor. A damping material is used because vibrations are not easily conveyed to a circuit board 2 even if the motor holder 3 contacts the circuit board 2.

The motor holding section 32 has a cylindrical inner surface suited to the outer shape of the cylindrical vibrating motor 1 in order to hold the motor 1. Moreover, the motor holding section 32 is provided with a slit 34 into which the motor 1 is inserted along the cylindrical inner surface.

The fixing section 31 has a function for fixing the motor holder 3 to the fixing hole 21 formed on the circuit board 2. The length 3B of the fixing section 31 is larger than the length 2A of the opening of the fixing hole 21 and slightly smaller than the length 2B of the fixing hole 21. The width of the fixing section 31 is set so as to be slightly smaller than the width 2D of the fixing hole 21 and the height 3A of the section 31 is set so as to be slightly larger than the thickness 2C of the circuit board 2. By pushing in the fixing section 31 from the direction F in FIG. 1 through the opening of the fixing hole 21, it is possible to insert the motor holder 3 into the fixing hole 21. Because of the above dimensions, the motor holder 3 is not easily removed from the opening after it is once inserted.

The tongue piece 33 has a function for fixing the motor holder 3 to the fixing hole 21 formed on the circuit board 2 the same as the fixing section 31 does and particularly, it prevents the motor holder 3 from vertically getting out of the fixing hole 21 formed on the circuit board 2. Moreover, the tongue piece 33 has functions for stably holding the motor holder 3 and effectively conveying vibrations of the motor 1 to the inner surface 41a of the case because it increases the area for the motor holder 3 to contact the inner surface 41a. At least either of the length of the longitudinal side of the tongue piece 33 and the length between both ends of the piece 33 is slightly larger than the corresponding side 2D or side 2B of the fixing hole 21. Therefore, the motor holder 3 whose fixing section 31 is fixed by the fixing hole 21 does not get out of the fixing hole 21.

Figure 2:
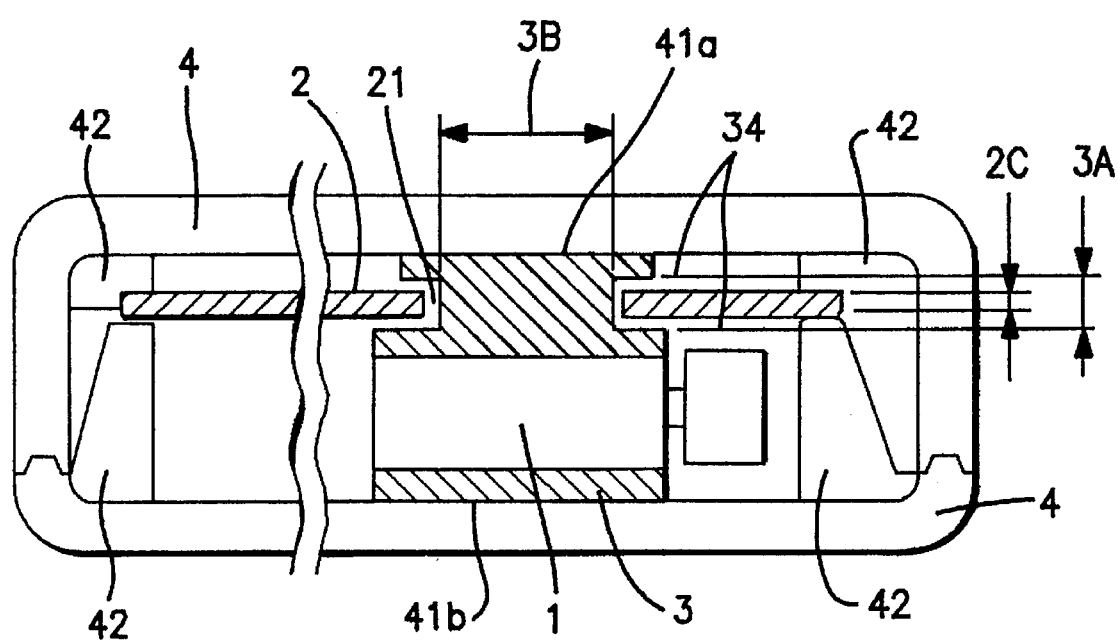
FIG. 2 is a partial sectional view showing the embodiment of FIG. 1 mounted in the case.

FIG. 2 shows the vibrating motor set in a case 4. In this embodiment, the case 4 is made of polycarbonate. The circuit board 2 is fixed to a circuit board holding rib 42 in the case 4. The motor holder 3 contacts the inner surface 41a of the case 4 at the position of the fixing hole 21 of the circuit board 2 and it is held by the inner surface 41a by being pressed from the both sides. The height 3A of the fixing section 31 equals the sum of the thickness 2C of the circuit board 2 and predetermined gaps 34 at the both sides of the circuit board 2. As already described, the fixing section 31 also has a predetermined gap in the in-plane direction of the circuit board 2. In this case, the gap is less than one millimeter. In this structure, even if the motor holder 3 contacts the circuit board 2, it is possible to reduce the undesirable sounds generated due to resonance of the circuit board 2 because the contact area between the holder 3 and the board 2 is small and the motor holder 3 uses a damping material.

As described above, the motor holder 3 is not easily moved due to the pressure applied by inner surfaces 41a and 41b of the case 4. However, it is also possible to roughen either or both of the tongue piece 33 of the holder 3 and the inner surface 41a of the case 4 with which the tongue piece 33 contacts in order to more securely fix the motor holder 3 in the case 4. Moreover, it is possible to roughen either or both of the motor holding section 32 and the inner surface 41b of the case 4. Furthermore, it is possible to apply an adhesive or an adhesive tape to the above portions instead of to roughen them. Furthermore, it is possible to form a fixing protrusion adjacent to an inner surface of the case with which the tongue piece 33 or the motor holding section 32 contacts. The circuit board 2 uses a circuit board made of epoxy resin and copper as a preferable example. It is also possible to use a circuit board made of other material (e.g. ceramic) for the board 2.

It is not always necessary to set the motor holder 3 to the central portion in the case 4 but it is also possible to set the holder 3 to a position separate from a printed circuit board when there is an extra space in the case 4.

Before assembling parts in the case 4, the following are first prepared. The vibrating motor 1 is inserted into the holding section 32 through the slit 34 formed along the holding section 32. Unless the holding section 32 has the slit 34, it is also possible to insert the vibrating motor 1 through a circular hole of the holding section 32 equivalent to the cross section of the motor 1. Furthermore, it is possible to apply an adhesive or an adhesive tape to the inner surface of the holding section 32 and/or the outer surface of the motor 1 so that the holding section 32 more securely holds the motor 1.

Then, the motor holder 3 is inserted into the fixing hole 21 by pushing the fixing section 31 through the opening of the fixing hole 21 in the direction F in FIG. 1. When the fixing hole 21 is present not at the lateral of the circuit board 2 but at the central portion of it, the motor holder 3 is constituted in the fixing hole 21 by previously dividing the motor holder 3 into a part including the motor holding section 32 and a part including the tongue piece 33 and then unifying the both parts into one body from the top and bottom of the fixing hole 21.

Assembly in the case 4 is performed as shown below. First, the circuit board 2 to which the motor holder 3 is fixed is set to a predetermined position of the printed-circuit-board holding rib 42 on the inner surface 41b of one side plate of the case 4. Then, the motor holder 3 is preferably adjusted and set so as to keep a predetermined gap from the circuit board 2 and these components are covered with the other side plate of the case 4 to form the case and hold the motor holder 3 with both inner surfaces 41a and 41b. According to the above structure, vibrations of the vibrating motor 1 are efficiently conveyed to the surface of the case 4 through the motor holder 3. In the case of this assembling method, because the fixing section 31 of the motor holder 3 is fixed to the fixing hole 21, the motor holder 3 is automatically set to an almost desired position by setting the circuit board 2 to a predetermined position in the case 4. Therefore, it is possible to simplify the process for setting the motor holder 3 in the frame independently of the circuit board 2.

When the vibrating motor mounting structure of the present invention is applied to a selective calling receiver, a display using liquid crystal or a light emitting diode or the like is set on a printed circuit board in addition to an electrical circuit. Moreover, a speaker and a buzzer are set on the board depending on the model. Furthermore, a battery receptacle is set in the case 4 and a battery is set in the battery receptacle. Though it is preferable to use a resin such as polycarbonate as the material of the case 4, it is also possible to use a metallic frame having an antenna function for the case 4. The case 4 has a length of approx. 5 cm, a width of approx. 7 cm, and a depth of approx. 1 to 2 cm.

While the present invention has been described in connection with certain preferred embodiments, it is to be understood that the subject matter encompassed by the present invention is not limited to those specific embodiments. On the contrary, it is intended to include all alternatives, modifications, and equivalents as can be included within the spirit and the scope of the following claims.

What is claimed is:

1. A structure for mounting a vibration-generating-motor within a case, comprising a motor holder for holding the vibration-generating-motor, wherein said holder comprises contact surfaces directly contacting opposite inner surfaces of said case, and wherein said holder is captive within a hole formed in a circuit board, and said contact surfaces are disposed on opposite sides of said circuit board.

2. The structure according to claim 1, wherein said hole opens on a peripheral edge of said circuit board.

3. The structure according to claim 1, wherein said holder comprises a tongue piece having transverse dimensions greater than said hole, said tongue piece overlying said hole, and a fixing section disposed within said hole and interconnecting said tongue piece and a holding section of said holder.

4. The structure according to claim 1, wherein said holder comprises a holding section defining a cylindrical cavity for receiving said motor.

5. The structure according to claim 1, wherein said motor holder is made of a damping material.

6. The structure according to claim 5, wherein said damping material is rubber, organic resin, or a macromolecular material.

7. A method for mounting a vibration-generating-motor within a case, comprising the steps of:

fitting a motor holder to a circuit board such that the motor holder is captive within a hole formed on the circuit board, and disposing the holder and circuit board within a case such that oppositely oriented contact surfaces of said holder directly contact opposite interior surfaces of said case.

8. The method according to claim 7, wherein said disposing step further comprises mounting said circuit board within said case, thereby to effect initial positioning of said motor holder, and performing final positioning of said motor holder such that said motor holder does not contact said circuit board.

* * * * *